US010039206B1

(12) United States Patent
Wishman et al.

(10) Patent No.: US 10,039,206 B1
(45) Date of Patent: Jul. 31, 2018

(54) SERVER RACKS INCLUDING SLIDING ELECTRICAL CONNECTION SYSTEMS

(71) Applicant: Amazon Technologies, Inc., Seattle, WA (US)

(72) Inventors: Max Jesse Wishman, Seattle, WA (US); Felipe Enrique Ortega Gutierrez, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/589,859

(22) Filed: May 8, 2017

(51) Int. Cl.
*H05K 7/14* (2006.01)
*H05K 7/18* (2006.01)

(52) U.S. Cl.
CPC ......... *H05K 7/1489* (2013.01); *H05K 7/1492* (2013.01); *H05K 7/183* (2013.01)

(58) Field of Classification Search
CPC ... H05K 7/1487; H05K 7/1489; H05K 7/1492
See application file for complete search history.

(56) References Cited

U.S. PATENT DOCUMENTS

| | | | |
|---|---|---|---|
| 6,544,057 B1 | 4/2003 | Stremick et al. | |
| 6,944,383 B1 | 9/2005 | Herzog et al. | |
| 8,376,103 B1 | 2/2013 | Sliger | |
| 8,418,219 B1 * | 4/2013 | Parsons | H04N 17/004 348/180 |
| 8,599,550 B2 * | 12/2013 | Davis | G11B 33/128 361/679.33 |
| 9,173,312 B1 | 10/2015 | Chen et al. | |
| 9,345,165 B1 * | 5/2016 | Phillips | H05K 7/1489 |
| 9,398,809 B2 * | 7/2016 | Ross | G06F 1/16 |
| 2004/0165357 A1 | 8/2004 | Schneeberger et al. | |
| 2006/0044766 A1 * | 3/2006 | Hartel | H02B 1/20 361/724 |
| 2006/0146581 A1 * | 7/2006 | Murphy | H05K 7/1492 363/37 |
| 2008/0144293 A1 * | 6/2008 | Aksamit | H05K 7/1489 361/727 |
| 2009/0034181 A1 * | 2/2009 | Gizycki | H01R 13/652 361/679.02 |
| 2010/0172083 A1 | 7/2010 | Randall et al. | |
| 2012/0069514 A1 | 3/2012 | Ross et al. | |
| 2012/0134099 A1 | 5/2012 | Zhang et al. | |
| 2013/0003317 A1 | 1/2013 | Gong et al. | |
| 2013/0077219 A1 | 3/2013 | Fu et al. | |

OTHER PUBLICATIONS

U.S. Appl. No. 14/733,710, filed Jun. 8, 2015, Titled: Cable Routing for Movable Trays.

* cited by examiner

*Primary Examiner* — Adrian S Wilson
(74) *Attorney, Agent, or Firm* — Kilpatrick Townsend & Stockton LLP (57) ABSTRACT

Slidable electrical connection systems are described. An example system may include a compute component that may include a slide component and an elongate conductive structure disposed at an outer casing of the compute component. The slide component may permit the compute component to move linearly between an extended position and a stowed position. The elongate conductive structure is configured and positioned to engage with an electrical contact of a support surface to form an electrical connection. The electrical connection is maintained at least while the compute component is moved between the extended position and the stowed position.

17 Claims, 8 Drawing Sheets

SERVER RACKS INCLUDING SLIDING ELECTRICAL CONNECTION SYSTEMS

BACKGROUND

A datacenter is a facility used to house a collection of computer servers and associated components, typically network hardware. Datacenters are commonly used for cluster computing, web services, remote data storage, web hosting, and other web services. Datacenters are increasingly being used by enterprises instead of, or in addition to, mainframe computers.

Compute components such as computer servers, network switches, and other data center hardware can be arranged in racks within a datacenter. Each rack receives power from a power distribution system of the datacenter. In some cases, a particular compute component in a particular rack may warrant attention (e.g., diagnostics, replacement, etc.). For example, an internal component of the particular compute component may need replacement.

BRIEF DESCRIPTION OF THE DRAWINGS

Various examples in accordance with the present disclosure will be described with reference to the drawings, in which.

DETAILED DESCRIPTION

In the following description, various examples will be described. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the example being described.

Examples described herein are directed to sliding electrical connection systems. In particular, the sliding electrical connection systems may be implemented to electrically connect any suitable rack-mounted compute component (e.g., hardware servers for computing or storage, networking hardware for switching or load balancing, and any other suitable compute device that may be used within a datacenter and mounted within a rack) to a server rack. Use of the sliding electrical systems enable a user to slide compute components into and out of the server rack while maintaining power to the compute components. This is achieved in a manner that does not rely on conventional electrical cables, plugs, and outlets to power (e.g., via direct current or alternating current) the compute component. Instead, the sliding electrical connection systems utilize electrical contacts integrally formed into the server rack that interface with exposed conductors of the compute components. The contacts and conductors are arranged in a manner that enables persistent contact between the contacts and the conductors while the compute components slide into and out of the server rack.

Turning now to a particular example, a compute component and a server rack are provided. The compute component includes a first slide component and a pair of elongate conductive strips disposed on a bottom surface of the compute component. This pair of conductive strips is positioned on the bottom surface to extend from a front edge in a direction towards a rear edge of the bottom surface. The conductive strips are electrically connected to a power supply system or other internal component that manages power of the compute component. The first slide component includes a set of channels or wheels to mechanically align the compute component with respect to the server rack and support the compute component during sliding movement. The server rack includes a shelf or bracket from which extends a pair of electrical contacts. The electrical contacts are electrically connected to a power distribution system associated with the server rack or a set of server racks. The server rack includes a second slide component including structure that corresponds to the first slide component. The second slide component functions to mechanically align the compute component with respect to the server rack. When the two slide components are coupled, a pair of independent electrical connections is formed between the server rack and the compute component. The electrical connections are maintained while compute component is moved linearly between an extended position (e.g., moved towards a front of the server rack) and a stowed position (e.g., moved towards a rear of the server rack). In the extended position, an operator or other user may access the compute component even while the compute component remains powered. This may be desirable for performing maintenance of the compute component, swapping internal elements of the compute component, running diagnostics, and performing any other operations.

Sliding electrical connection systems may be implemented relative to a server rack, a network hardware rack, or a tape library rack. To avoid having to repeat varied terms throughout the description, as used herein in the specification and claims, any use of "rack" (even if modified specifically by "server," "network hardware," "compute component," or "tape library" etc.) may be utilized to mean any of a server rack, a network hardware rack, a compute component, a tape library rack, or a rack that includes any combination of these options.

Figure 1:
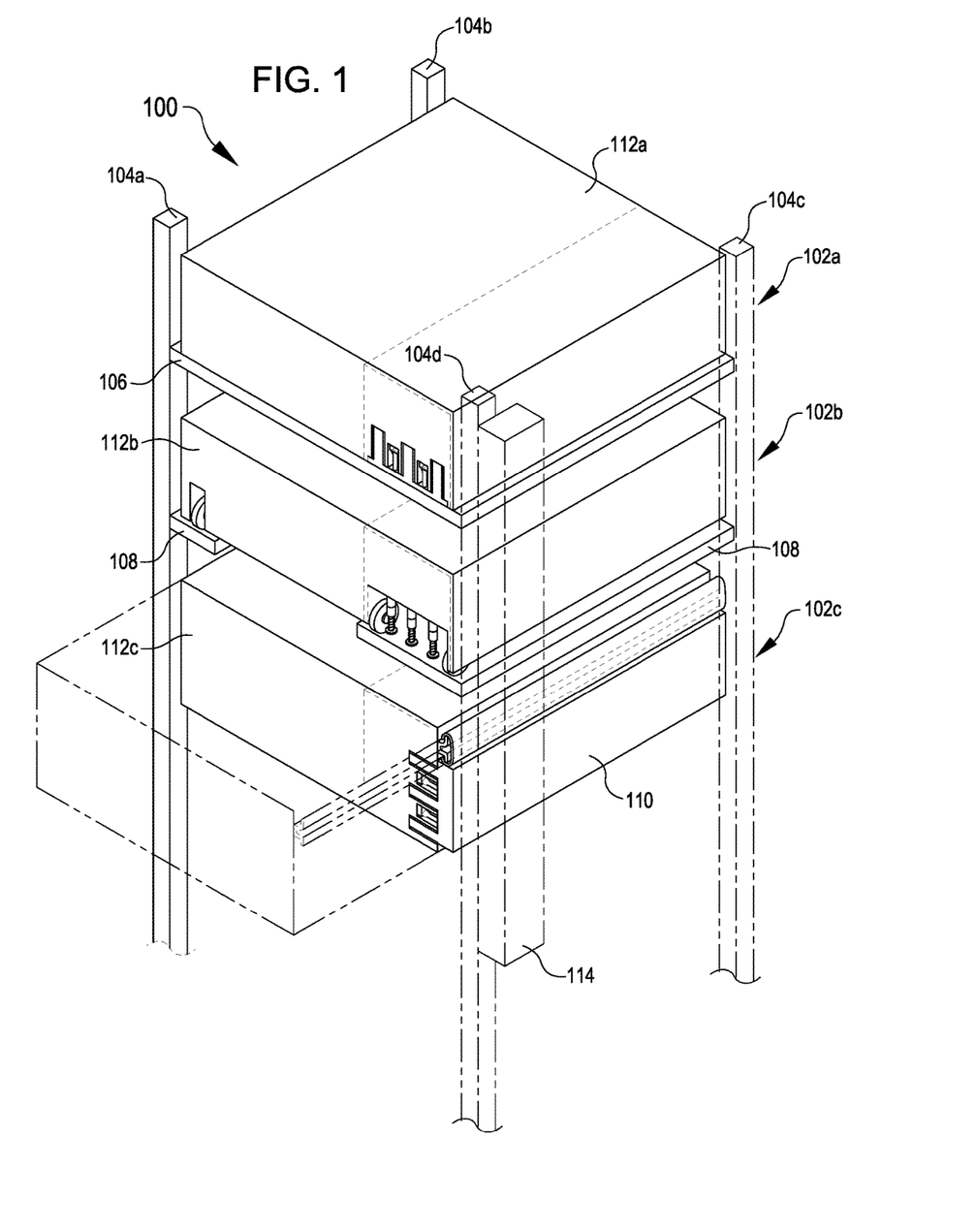
FIG. 1 illustrates a perspective view of a server rack including various sliding electrical connection systems, according to at least one example.
Figure 2:
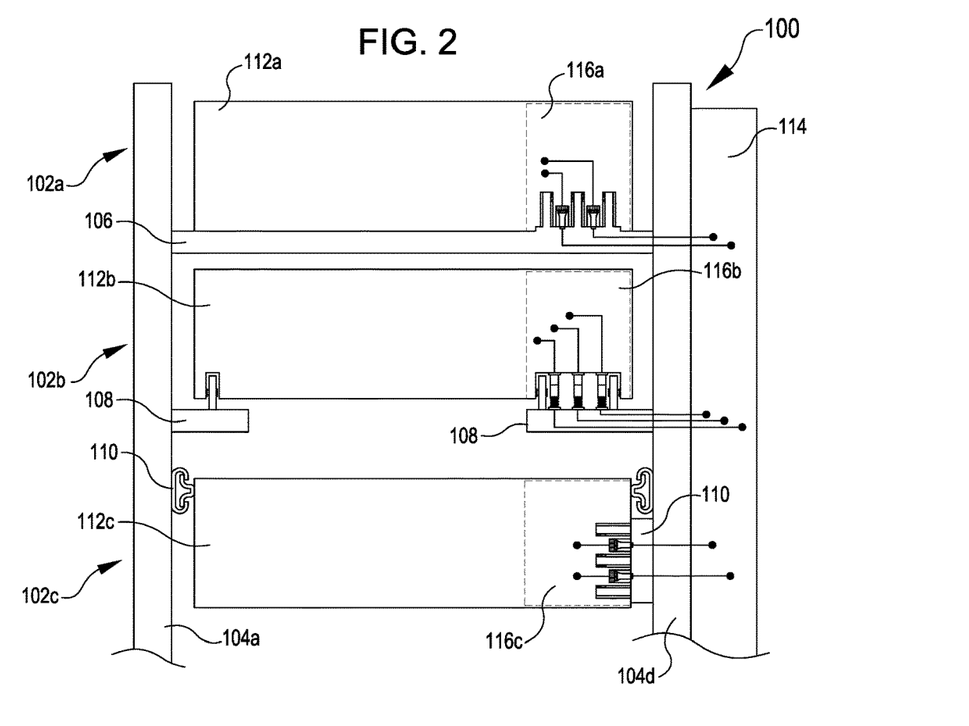
FIG. 2 illustrates a front view of the server rack from FIG. 1, according to at least one example.

Turning now to the figures, FIGS. 1 and 2 illustrate a server rack system 100 including various sliding electrical connection systems 102a, 102b, and 102c, according to various examples. The server rack system 100 can be any suitable structure configured to store 112 compute components such as those described herein. For example, the server rack system 100 can include a server rack frame 104 formed from a plurality of legs 104a-104d that support one or more shelves 106, "L" brackets 108, side brackets 110, and other support structures. The compute components 112 can be supported by the shelves 106, the L brackets 108, the side brackets 110, and any other suitable support structure.

The server rack system 100 can be defined as having a plurality of sides (e.g., a top side, a bottom side, a front side, a rear side, a right side, and a left side). The compute components 112 can be supported within the server rack system 100 in any suitable manner. For example, the compute components 112 can extend between the right side and the left side (e.g., a horizontal orientation). The compute components 112 can also extend between the top side and the bottom side or the top side and a shelf disposed between the bottom side and the top side. For example, the compute components 112 can hang from the top side in a vertical orientation. In some examples, the compute components 112 are supported in a vertical orientation by the bottom side. Thus, the sliding electrical connection systems 102 described herein can be implemented between any side of the server rack system 100 and any side of the compute component 112.

In some examples, the server rack system 100 holds the compute components 112 having various dimensions (e.g., 1 rack unit (U), 2 U, 3 U, 4 U, etc.). In some examples, the server rack system 100 is configured to hold a total of 42 U distributed between any suitable number of compute components. Each compute component 112 may include an exterior casing to which mounting and slide components described herein can be attached. In some examples, the compute component 112 may include an internal frame to which internal components and/or the mounting and slide components are attached. The internal frame can be encased within the exterior casing.

In some examples, the server rack system 100 includes sliding electrical connection systems 102 of the same type. The same server rack system 100 may also include sliding electrical connection systems 102 of different types, as illustrated in FIGS. 1 and 2. Each of the sliding electrical connection systems 102 include the compute component 112 that is configured to slide with respect to the server rack system 100 between an extended position and a stowed position. For example, as depicted by the sliding electrical connection system 102c in FIG. 1, a compute component 112c is configured to slide between an extended position (e.g., shown in phantom lines) and a stowed position (e.g., shown in solid lines).

The server rack system 100 also includes a power distribution unit (PDU) 114. The PDU 114 can be attached to the server rack system 100 or disposed adjacent to the server rack system 100. The PDU 114 may provide power to more than one server rack 104. In the example illustrated, the PDU 114 is configured to provide power to the sliding electrical connection systems 102. In particular the PDU 114 may provide power to the shelves 106, the L brackets 108, and/or the side brackets 110, which is then transferred to the compute components 112 via independent electrical connections, as described in detail herein.

As illustrated in FIG. 2, the PDU 114 can provide power using direct current (DC) and/or alternating current (AC). For example, the sliding electrical connection systems 102a and 102c are powered using DC (e.g., power and ground), while the sliding electrical connection system 102c is powered using AC (e.g., power, ground, and neutral). Each sliding electrical connection system 102 may also include a power supply unit (PSU) 116. The PSU 116 and the PDU 114 can convert AC to DC or DC to AC, depending on the implementation. For example, the sliding electrical connection system 102b may run off of AC power that has been converted from DC by the PSU 116b or the PDU 114.

In some examples, the exterior casings of the compute components 112 and the PSUs 116 are adapted to implement the techniques described herein. For example, the PSUs 116 may be manufactured and assembled together with conventional computing components within the casings of the compute components 112. In some examples, the casing is also adapted to implement the techniques described herein.

Figure 3:
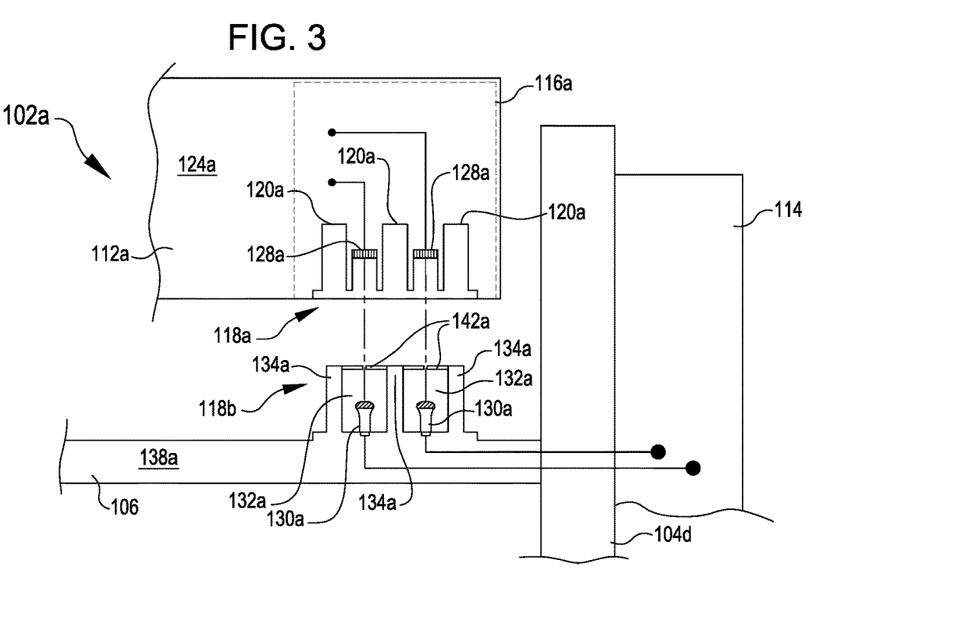
FIG. 3 illustrates an exploded front view of a sliding electrical connection system, according to at least one example.
Figure 4:
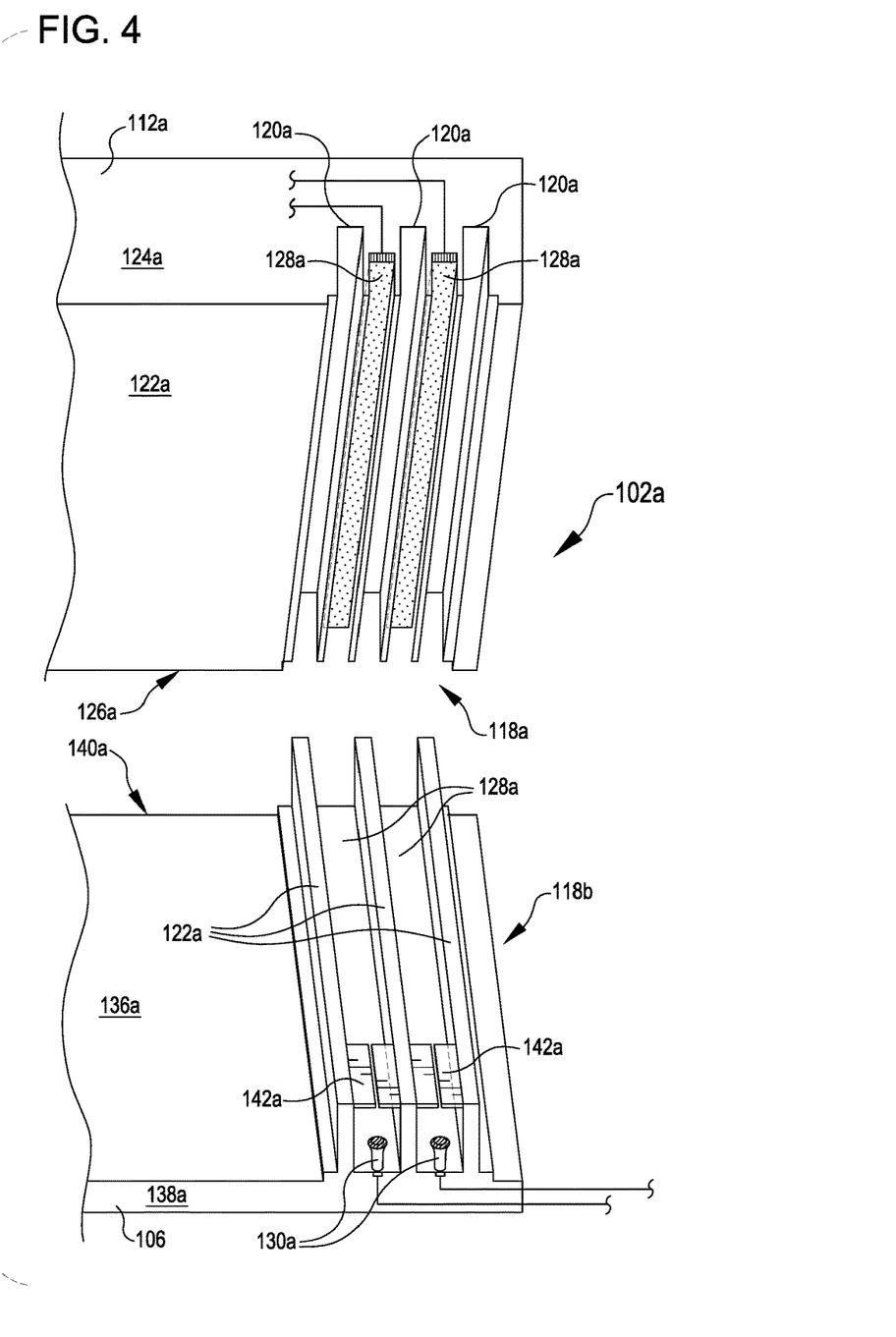
FIG. 4 illustrates an exploded perspective view of the sliding electrical connection system from FIG. 3, according to at least one example.

FIG. 3 illustrates an exploded front view of the sliding electrical connection system 102a and FIG. 4 illustrates an exploded perspective view of the sliding electrical connection system 102a, according to at least one example. The sliding electrical connection system 102a includes the compute component 112a supported by the shelf 106. In some examples, the sliding electrical connection system 102a includes the compute component 112a supported by the L bracket 108. Beginning with the compute component 112a, the compute component 112a may include a first part 118a of a slide component 118. The first part 118a may include a set of openings 120a. The set of openings 120a may have any suitable cross sectional shape (e.g., rectangular, square, spheroidal, triangular, etc.). In some examples, the set of openings 120a is defined as a set of elongate channels formed into a bottom side surface 122a of the compute component 112a.

For example, as illustrated in detail in FIG. 4, the set of openings 120a may be formed in the bottom side surface 122a. The set of openings 120a may begin at a position adjacent to a front side surface 124a of the compute component 112a and extend towards a rear side surface 126a of the compute component 112a. In some examples, the set of openings 120a extend the entire length of the bottom side surface 122a from the front side surface 124a to the rear side surface 126a. In some examples, the set of openings 120a extend from the front side surface 124a to a position adjacent to a middle length of the bottom side surface 122a. Generally, the set of openings 120 may have an elongate profile.

The first part 118a may also include a set of conductive structures 128a. The number of conductive structures 128a may correspond to a number of contacts (e.g., contacts 130a) of the second part 118b. Like the set of openings 120a, the set of conductive structures 128a may be installed, attached, or otherwise formed into the bottom side surface 122a of the compute component 112a. Generally, the conductive structures 128 may have an elongate profile. In some examples, the conductive structures 128 are elongate strips of conductive material.

The set of conductive structures 128a may begin at a position adjacent to the front side surface 124a of the compute component 112a and extend towards the rear side surface 126a of the compute component 112a. In some examples, the set of conductive structures 128a extend the entire length of the bottom side surface 122a from the front side surface 124a to the rear side surface 126a. In some examples, the set of conductive structures 128a extend from the front side surface 124a to a position adjacent to a middle length of the bottom side surface 122a. The length of the conductive structures 128a may correspond an extension length measured from a stowed position of the compute component 112a and an extended position of the compute component 112a. In some examples, if the compute component 112a is extended beyond the extension length, power to the compute component 112a may be severed as a result of the contacts 130a no longer contacting the conductive structures 128a.

The second part 118b of the slide component 118 includes the contacts 130a disposed within a set of openings 132a. The contacts 130a are electrically connected to the PDU 114 or other power system. While FIGS. 3 and 4 illustrate two contacts 130a (e.g., a positive contact and a negative contact), it should be understood that more or fewer contacts 130a may be provided depending on the implementation. For example, three or more contacts 130a or a single contact 130a may be provided in various examples. Generally, the contacts 130 may be formed from an electrically conductive material such as copper, lead, aluminum, or other conductive material.

The set of openings 132a is defined by a set of walls 134a. The set of walls 134a may correspond in size and shape to the set of openings 120a of the first part 118a. For example, the set of openings 120a may be a set of channels that is configured to receive the set of walls 134a. In some examples, alignment of the set of openings 120a with the set of walls 134a also aligns the set of conductive structures 128a with the contacts 130a. In some examples, the set of walls 134 together with the set of openings 132a form a set of tracks in the second part 118b. The set of openings 120a together with the openings in which the conductive structures 128a are disposed may also form a set of corresponding tracks in the first part 118a.

In some examples, the height of the walls 134a and the depth of the openings 120a are selected such that, when the compute component 112a is supported by a top side surface 136a of the shelf 106 and the second part 118b, the contacts 130a physically contact the conductive structures 128a. Such physical contact will be sufficient to create electrical connections between the contacts 130a and the conductive structures 128a.

Like the set of openings 120a and the conductive structures 128a, the set of walls 134a and the set of openings 132a may begin at a position adjacent to a front side surface 138a and extend towards a back side surface 140a along the top side surface 136a.

The slide component 118 is configured such that electrical connections between the contacts 130a and the conductive structures 128a persist while the compute component 112a is moved linearly with respect to the contacts 130a. For example, as illustrated in FIG. 4, with the contacts 130a disposed adjacent to the front side surface 138a of the shelf 106 and the conductive structures 128a extending the entire length of the compute component 112a, the sliding electrical connection system 102a is enabled for maximum translation (e.g., almost a full length of the compute component 112a) while keeping persistent electrical connections.

Although described as having openings on the compute component and contacts on the shelf or rack, these components may be switched, with the contacts on the compute component and the openings on the rack.

The second part 118b may also include safety components 142a. Each safety component 142a may function to restrict overhead access to the contacts 130a. This may be desirable to limit the possibility of electrocution from a user coming into contact with the contacts 130a and/or other objects contacting the contacts 130a, which could cause a short circuit. To this end, each the safety component 142a may include a pair of wings, with one edge of each wing attached to one of the walls 134a. The wings may pivot inwards as the conductive structures 128a are lowered towards the contacts 130a. In some examples, the safety components 142a are held in an access position at least while the shelf 106 supports the compute component 112a. In some examples, the safety component 142a include continuous sheet of deformable material with a slit or set of slits positioned over the contacts 130a. When the second part 118b is lowered towards the first part 118a, the second part 118b may cause the material to deflect and the contacts 130a to extend through the slits. In some examples, the safety components 142a extend the entire length of the compute component 112a and/or also cover ends of the openings 132a.

Figure 5:
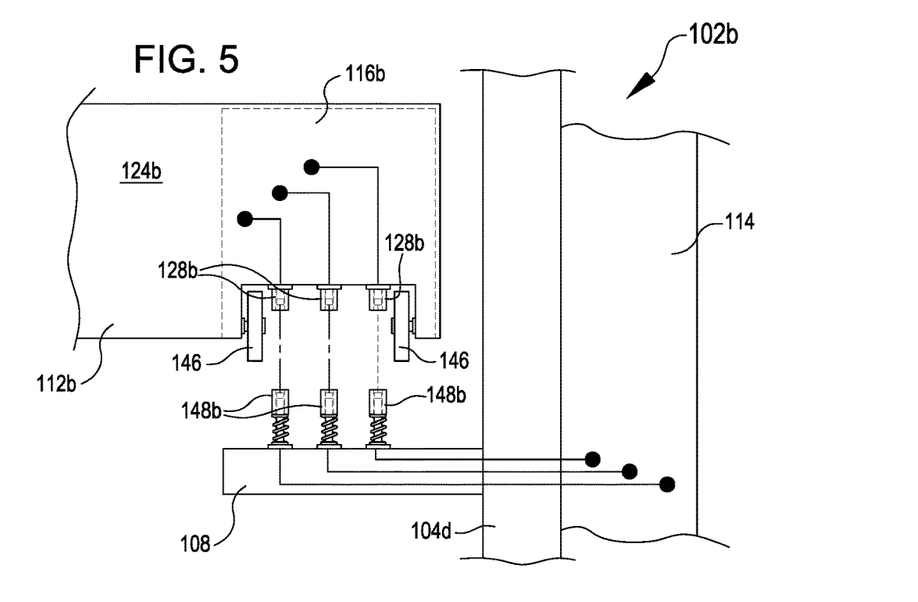
FIG. 5 illustrates an exploded front view of a sliding electrical connection system, according to at least one example.
Figure 8:
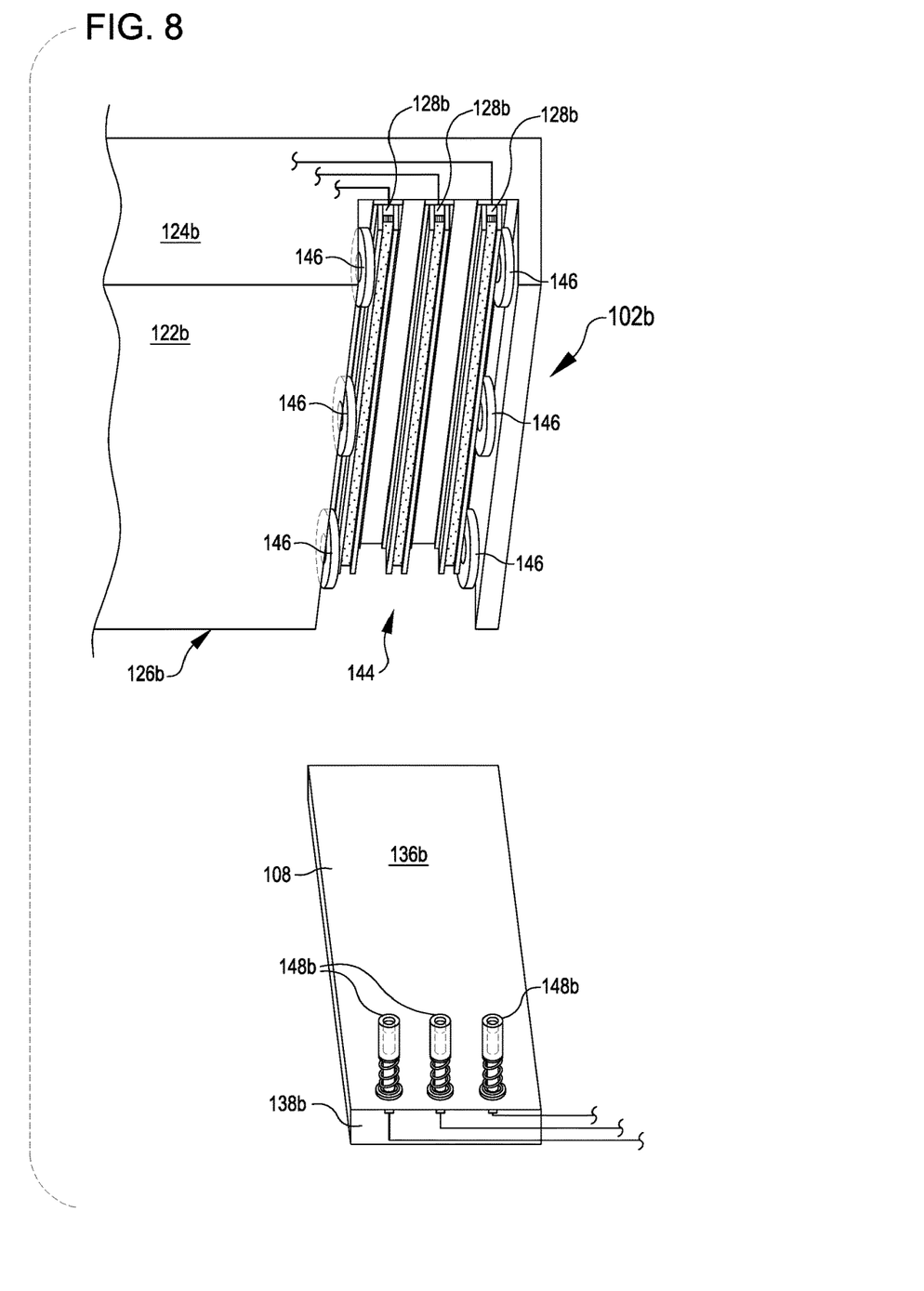
FIG. 8 illustrates an exploded perspective view of the sliding electrical connection system from FIG. 5, according to at least one example.

FIG. 5 illustrates an exploded front view of the sliding electrical connection system 102b and FIG. 8 illustrates an exploded perspective view of the sliding electrical connection system 102b, according to at least one example. The sliding electrical connection system 102b includes the compute component 112b supported by the L bracket 108. In some examples, the sliding electrical connection system 102b includes the compute component 112b supported by the shelf 106. Beginning with the compute component 112b, the compute component 112b may include a slide component 144. The slide component 144 is an example of the slide component 118.

The slide component 144 may include a set of wheels 146 or other rolling members, with a set of conductive structures 128b disposed between the set of wheels 146. Like the conductive structures 128a, the conductive structures 128b can extend along a bottom side surface 122b of the compute component 112b. The set of wheels 146 can include wheels that are aligned at different distances from a front side surface 124b along the bottom side surface 122b. For example, a first set of wheels 146 is disposed adjacent to the front side surface 124b, a second set of wheels 146 is disposed adjacent to a rear side surface 126b, and a third set of wheels 146 is disposed between the first set of wheels 146 and the second set of wheels 146. In some examples, other wheels 146 are provided on the bottom side surface 122 to support the compute component 112b (see, e.g., FIGS. 1 and 2).

In some examples, the wheels 146 are configured to support the compute component 112b as the compute component 112b moves linearly between an extended position and a stowed position.

As illustrated in FIGS. 5 and 8, the shelf 108 may include a set of stowable contacts 148b. The set of stowable contacts 148b may be attached to a top side surface 136b adjacent to a front side surface 138b. In some examples, the stowable contacts 148b are integrally formed as part of the L bracket 108 or as part of the shelf 106.

Figure 6:
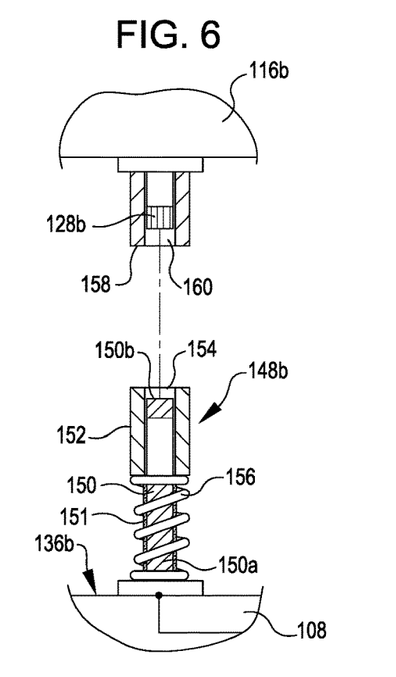
FIG. 6 illustrates a side view of an electrical contact with an insulative component in an extended position, according to at least one example.
Figure 7:
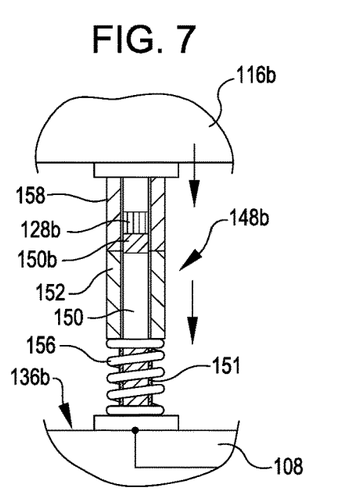
FIG. 7 illustrates a side view of the electrical contact from FIG. 6 with the insulative component in a compressed position, according to at least one example.

As illustrated in FIGS. 6 and 7, each stowable contact 148b includes a conductive rod 150 that includes a proximal end 150a disposed adjacent to the top side surface 136b. The stowable contact 148b also includes a distal end 150b opposite the proximal end 150a. The conductive rod 150 can be formed from any suitable conductive material such as cooper, lead, aluminum, and any other suitable material. The stowable contact 148b also includes an insulative component 152 that includes an opening 154. The opening 154 extends through the insulative component 152. For example, the insulative component 152 may have a cylindrical cross section with a hollow middle corresponding to the opening 154. The conductive rod 150 is threaded through the opening 154 of the insulative component 152 to enable the insulative component 152 to translate in a first and second direction parallel to a central axis of the conductive rod 150. Such threading creates a slidable coupling between the insulative component 152 and the conductive rod 150. The stowable contact 148b also includes a spring member 156 positioned between a bottom surface of the insulative component 152 and the top side surface 136b.

As illustrated in FIGS. 6 and 7, the compute component 112b may also include an engaging structure 158 disposed adjacent to the conductive structure 128b. The engaging structure 158 may include an opening 160 in which the conductive structure 128b is disposed. In some examples, the engaging structure 158 is provided to engage with the insulative component 152 so as to exert a downward force on a top surface of the insulative component 152 to cause translation of the insulative component 152 (e.g., compression of the spring member 156) and presentation of the distal end 150b.

For example, the spring member 156 may be configured to cause translation of the insulative component 152 between an extended position, e.g., as illustrated in FIG. 6 and a stowed or compressed position, e.g., as illustrated in FIG. 7. In the extended position, a top surface of the insulative component 152 extends above the distal end 150b of the conductive rod 150. Thus, in the extended position, the insulative component 152 covers the distal end 152b of the conductive rod 150. This may be desirable to limit the possibility of electrocution from a user coming into contact with the conductive rod 150 and/or other objects contacting the conductive rod 150. In the stowed position, the distal end 150b of the conductive rod 150 extends above the top surface of the insulative component 152 and contacts the conductive structure 128b. Thus, in the stowed position, the insulative component 150 has translated in a direction towards the top side surface 136b so as to reveal the distal end 152b of the conductive rod 150. In some examples, a force resulting from the mass of the compute component 112b may be sufficient to compress the spring member 156, as illustrated in FIG. 7. The contact 148b may be suitably rigid and the spring member 156 suitable robust to maintain physical contact between the distal end 152b and the conductive structure 128b while the compute component 112b is translated horizontally with respect to the contacts 148.

In some examples, the portion of the conductive rod 150, as illustrated in FIG. 6, disposed between the bottom surface of the insulative component 152 and the top side surface 136b (e.g., between the spring member 156 and the conductive rod 150) may include a flexible insulative barrier. For example, a flexible insulative sleeve 151 may be applied over this portion of the conductive rod 150 to insulate this portion of the conductive rod 150 from inadvertent contact, arcing, etc.

Figure 9:
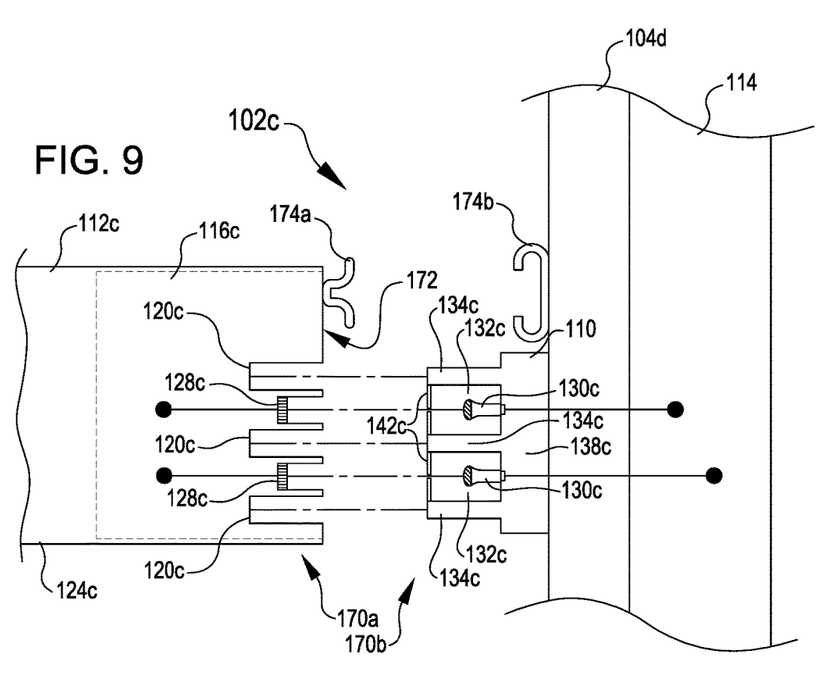
FIG. 9 illustrates an exploded perspective view of a sliding electrical connection system, according to at least one example.

FIG. 9 illustrates an exploded front view of the sliding electrical connection system 102c, according to at least one example. The sliding electrical connection system 102c includes the compute component 112c and the side bracket 110. The side bracket 110 is attached to the leg 104d of the server rack frame 104. Beginning with the compute component 112c, the compute component 112c may include a first part 170a of a slide component 170. The slide component 170 is an example of the slide component 118. Thus, the first part 170a may include the set of openings 120c.

In some examples, the set of openings 120c are defined as elongate channels formed into a side surface 172 of the compute component 112c. For example, the set of openings 120c may begin at a position adjacent to a front side surface 124c of the compute component 112c and extend towards a rear side surface of the compute component 112c. In some examples, the set of openings 120c extend the entire length of the side surface 172 from the front side surface 124c to the rear side surface. In some examples, the set of openings 120c extend from the front side surface 124c to a position adjacent to a middle length of the side surface 172.

The first part 170a may also include a set of conductive structures 128c. The number of conductive structures 128c may correspond to the number of contacts (e.g., contacts 130c) of a second part 170b. Like the set of openings 120c, the set of conductive structures 128c may be installed, attached, or otherwise formed into the side surface 172c of the compute component 112c. The set of conductive structures 128c may begin at a position adjacent to the front side surface 124c of the compute component 112c and extend towards the rear side surface of the compute component 112c. In some examples, the set of conductive structures 128c extend the entire length of the side surface 172 from the front side surface 124c to the rear side surface. In some examples, the set of conductive structures 128c extend from the front side surface 124c to a position adjacent to a middle length of the side surface 172. The length of the conductive structures 128c may correspond an extension length measured from a stowed position of the compute component 112c and an extended position of the compute component 112c. In some examples, if the compute component 112c is extended beyond the extension length, power to the compute component 112c may be severed as a result of the contacts 130c no longer contacting the conductive structures 128c.

The second part 170b of the slide component 170 includes the contacts 130c disposed within a set of openings 132c. The contacts 130c are electrically connected to the PDU 114 or other power system. While FIG. 9 illustrates two contacts 130c (e.g., a positive contact and a negative contact), it should be understood that more or fewer contacts 130c may be provided depending on the implementation. For example, three or more contacts 130c or a single contact 130c may be provided in various examples.

The set of openings 132c are defined by a set of walls 134c. The set of walls 134c may correspond in size and shape to the set of openings 120c of the second part 170b. For example, the set of openings 120c may be a set of channels that receive the set of walls 134c. In some examples, alignment of the set of openings 120c with the set of walls 134c also aligns the set of conductive structures 128c with the contacts 130c. In some examples, the height of the walls 134c and the depth of the openings 120c are selected such that, the contacts 130c physically contact the conductive structures 128c. Such physical contact will be sufficient to create electrical connections between the contacts 130c and the conductive structures 128c.

Like the set of openings 120c and the conductive structures 128c, the set of walls 134c and the set of openings 132c may begin at a position adjacent to a front side surface 138c and extend towards a back side surface along the side surface 172.

The slide component 170 is configured such that electrical connections between the contacts 130c and the conductive structures 128c persist while the compute component 112c is moved linearly with respect to the contacts 130c. For example, with the contacts 130c disposed adjacent to the front side surface 138c and the conductive structures 128c extending the entire length of the compute component 112c, the sliding electrical connection system 102c is enabled for maximum translation while keeping persistent electrical connections.

The second part 170b may also include safety components 142c, which may be configured as discussed with reference to safety components 142a.

In addition to the sliding electrical connection systems 102a and 102b, the sliding electrical connection system 102c may include a set of alignment structures 174a, 174b. A first alignment structure 174a may be attached to the compute component 112c. A second alignment structure 174b may be attached to the leg 104d or other part of the server rack frame 104. In some examples, the alignment structures 174a, 174b are examples of drawer slides. In this manner, the alignment structures 174a, 174b may mechanically support and maintain proper alignment of the compute component 112c with respect to the server rack frame 104. In some examples, alignment structures similar to the alignment structures 174 may be installed in the sliding electrical connection systems 102a, 102b, and/or 102d. For example, such alignment structures may be installed on the bottom side surface 122 and the top side surface 136. In some examples, such alignment structures may be installed on side surfaces and corresponding parts of the server rack frame 104.

Figure 10:
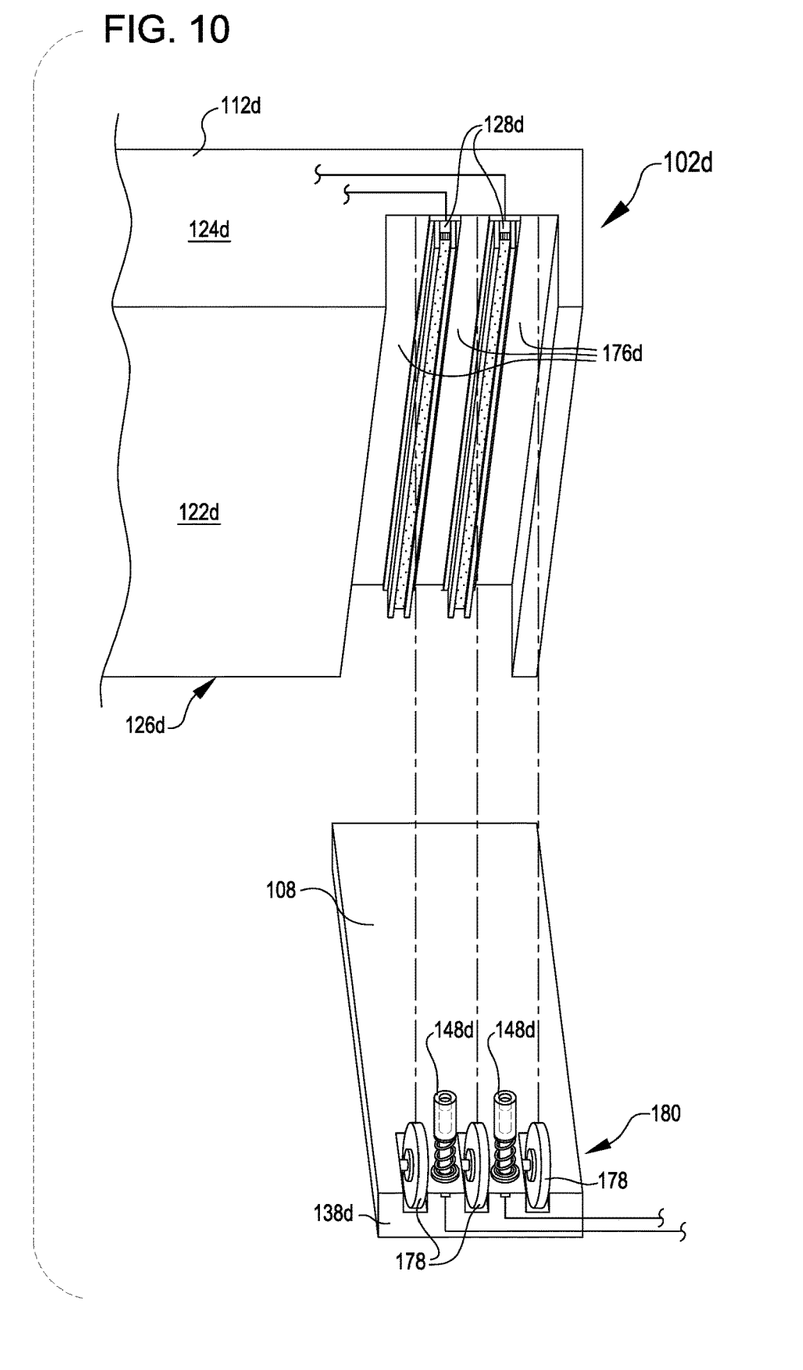
FIG. 10 illustrates an exploded front view of a sliding electrical connection system, according to at least one example.

FIG. 10 illustrates an exploded perspective view of the sliding electrical connection system 102d, according to at least one example. The sliding electrical connection system 102d includes the compute component 112d supported by the L bracket 108. In some examples, the sliding electrical connection system 102b includes the compute component 112d supported by the shelf 106. Beginning with the compute component 112d, the compute component 112d may include a set of openings 176d and a set of conductive structures 128d. When the shelf 106 or L bracket 108 includes stowable contacts 148d, the compute component 112d may be configured as described with reference to FIGS. 5 and 6. The set of openings 176d may be positioned and adapted to receive a set of wheels 178 or rolling members of a slide component 180 of the L bracket 108. For example, the set of openings 176d may function as tracks for the wheels 178 to roll in. The slide component 180 is an example of the slide components 118 and 144.

In some examples, the set of wheels 178 and the stowable contacts 148d are disposed adjacent to a front side surface 138d. The stowable contacts 148d may be configured as described with reference to FIGS. 5 and 6. In some examples, the wheels 146 are configured to support the compute component 112d as the compute component 112d moves linearly between an extended position and a stowed position.

Figure 11:
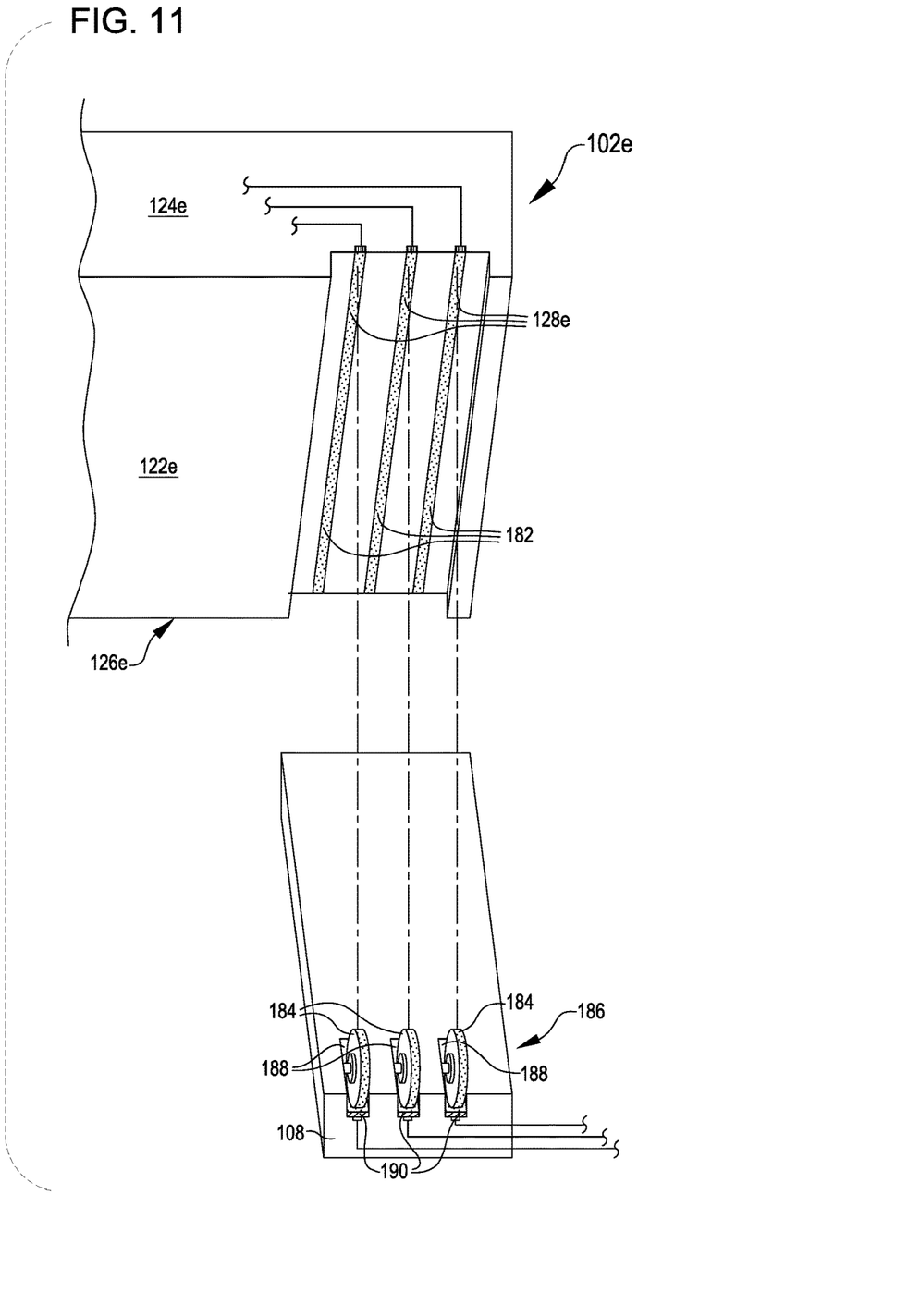
FIG. 11 illustrates an exploded front view of a sliding electrical connection system, according to at least one example.

FIG. 11 illustrates an exploded perspective view of a sliding electrical connection system 102e, according to at least one example. The sliding electrical connection system 102e includes the compute component 112e supported by the L bracket 108. In some examples, the sliding electrical connection system 102e includes the compute component 112e supported by the shelf 106. Beginning with the compute component 112e, the compute component 112e may include a set of conductive structures 128e disposed within a set of openings 182. The set of conductive structures 128e may extend from a front side surface 124 towards a rear side surface 126e along a bottom side surface 122e.

The set of openings 182 may correspond in size and dimension to a set of conductive wheels 184 or rolling members of a slide component 186 of the L bracket 108 or the shelf 106. In some examples, as illustrated, the set of openings 182 can be disposed within a generally recessed portion of the bottom side surface 122e. Each conductive wheel 184 may include a conductive circumferential exterior surface. The set of wheels 184 may be recessed within openings 188 in the L bracket 108. Within lower portions of the openings 188 may be disposed conductive pads 190. The conductive pads 190 are in physical contact with the conductive circumferential exterior surfaces of the conductive wheels 184. In operation, the set of conductive wheels 184 may provide support to the compute component 112e. Independent electrical connections can also be formed between the contact pads 190 and the conductive structures 128e via the conductive wheels 184. In this manner, the conductive wheels 184 provide physical support of the compute component 112e and electrical connections between a power system and the compute component 112e. The conductive wheels 184 can be supported by axles formed from an insulative material.

Based at least in part on the disclosure and teachings provided herein, a person of ordinary skill in the art will appreciate other ways and/or methods to implement the various examples. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
   a compute component rack comprising a horizontal support structure, the horizontal support structure comprising:
      a top support side, a front support side, and a rear support side;
      a set of tracks disposed on the top support side and extending in a direction from the front support side towards the rear support side;
      a first electrical contact disposed on the top support side adjacent to the front support side and within a first support track of the set of support tracks;
      a second electrical contact disposed on the top support side adjacent to the front support side and within a second support track of the set of support tracks,
      the first and the second electrical contacts extending upwardly from the top support side; and
   a compute component comprising:
      a bottom component side, a front component side, and a rear component side, wherein a set of openings is formed in the bottom component side, at least a portion of the set of openings being configured to receive the set of tracks;
      a first conductive strip disposed on the bottom component side and extending within a first opening of the set openings in the direction from the front component side towards the rear component side; and
      a second conductive strip disposed on the bottom component side and extending within a second opening of the set openings in the direction from the front component side towards the rear component side,
      wherein the horizontal support structure is configured to receive the compute component to form independent electrical connections between the first electrical contact and the first conductive strip and the second electrical contact and the second conductive strip, the independent electrical connections persisting at least while the compute component slides horizontally with respect to the horizontal support structure.

2. The system of claim 1, wherein the first electrical contact is a positive electrical contact and the second electrical contact is a negative electrical contact.

3. The system of claim 1, wherein:
   the first track comprises a first wall and a second wall, with the first electrical contact disposed between the first wall and the second wall; and
   the second track comprises the second wall and a third wall, with the second electrical contact disposed between the second wall and the third wall.

4. The system of claim 3, wherein the set of openings comprises:
   a third opening configured and positioned to receive the first wall;
   a fourth opening configured and positioned to receive the second wall, with the first opening disposed between the third opening and the fourth opening; and
   a fifth opening configured and positioned to receive the third wall, with the second opening disposed between the fourth opening and the fifth opening.

5. A datacenter component, comprising:
   an outer casing;
   a slide component comprising a pair of channels disposed at the outer casing and permitting the datacenter component to move linearly between an extended position and a stowed position; and
   an elongate conductive structure disposed between the pair of channels at the outer casing,
   wherein the elongate conductive structure is configured and positioned to:
      engage with an electrical contact of a rack to which the slide component is supported for sliding to form an electrical connection when the datacenter component is supported by the rack; and
      maintain the electrical connection at least while the datacenter component undergoes horizontal movement between the extended position and the stowed position via the slide component.

6. The datacenter component of claim 5, wherein the slide component and the elongate conductive structure are disposed at the outer casing along a horizontal bottom surface of the datacenter component.

7. The datacenter component of claim 6, wherein the elongate conductive structure is disposed within an elongate recessed portion on the horizontal bottom surface.

8. The datacenter component of claim 6, wherein the slide component further comprises a pair of wheels, with the elongate conductive structure disposed between the pair of wheels.

9. The datacenter component of claim 5, further comprising a power supply unit that is electrically connected to the elongate conductive structure.

10. The datacenter component of claim 5, wherein the slide component and the elongate conductive structure are disposed at the outer casing along a vertical side surface of the datacenter component.

11. The datacenter component of claim 10, wherein the elongate conductive structure is disposed between the pair of channels.

12. The datacenter component of claim 10, further comprising a first alignment component that is disposed on the vertical side surface and configured to slidably couple with a second alignment structure of the support surface to support the datacenter component at least while the datacenter component undergoes the horizontal movement between the extended position and the stowed position via the slide component.

13. The datacenter component of claim 5, wherein the elongate conductive structure extends from a position adjacent to a front side of the datacenter component in a direction towards a rear side of the datacenter component.

14. A compute component rack, comprising:
   a support surface by which a compute component is mountable for horizontal movement; and a pair of conductive wheels extending from the support surface in a direction, a pair of circumferential exterior surfaces of each of the pair of conductive wheels configured to engage with a pair of conductive strips of the compute component mounted on the support surface to form a pair of electrical connections, the pair of electrical connections maintained at least while the compute component undergoes the horizontal movement with respect to the pair of conductive wheels.

15. A datacenter component, comprising:

an outer casing;

a slide component comprising a pair of wheels disposed at the outer casing and permitting the datacenter component to move linearly between an extended position and a stowed position; and a contact disposed at the outer casing, wherein the contact is configured and positioned to:
   engage with an elongate conductive structure of a rack to which the slide component is supported for sliding to form an electrical connection when the datacenter component is supported by the rack; and
   maintain the electrical connection at least while the datacenter component undergoes horizontal movement between the extended position and the stowed position via the slide component.

16. A compute component rack, comprising:

a support surface by which a compute component is mountable for horizontal movement;

a pair of electrical contacts disposed on the support surface and extending from the support surface in a direction, the pair of electrical contacts configured to engage with a pair of conductive strips of the compute component mounted on the support surface to form a pair of electrical connections, the pair of electrical connections maintained at least while the compute component undergoes the horizontal movement with respect to the pair of electrical contacts;

a pair of walls extending away from the support surface in the direction, the pair of walls positioned and configured to slidably couple with openings in the compute component; and a safety component extending between the pair of walls and positioned over a first electrical contact of the pair of electrical contacts, the safety component being deflectable between:
   a first state in which the safety component restricts overhead access to the first electrical contact; and
   a second state in which the safety component allows overhead access to the first electrical contact, the second state occurring when the compute component is mounted on the support surface.

17. A compute component rack, comprising:

a support surface by which a compute component is mountable for horizontal movement; and a pair of electrical contacts disposed on the support surface and extending from the support surface in a direction, the pair of electrical contacts configured to engage with a pair of conductive strips of the compute component mounted on the support surface to form a pair of electrical connections, the pair of electrical connections maintained at least while the compute component undergoes the horizontal movement with respect to the pair of electrical contacts, wherein each electrical contact of the pair of electrical contacts comprises:

a conductive rod comprising a proximal end disposed adjacent to the support surface and a distal end opposite the proximal end;

an insulative component comprising an opening through which the conductive rod is slidably coupled to the insulative component; and a spring member positioned between a bottom surface of the insulative component and the support surface, the spring member configured to cause translation of the insulative component between:
   an extended position at which a top surface of the insulative component extends above the distal end of the conductive rod; and
   a compressed position at which the distal end of the conductive rod extends above the top surface of the insulative component, wherein the respective electrical connections are formed when the respective insulative components are in the compressed positions.

\* \* \* \* \*